(12) United States Patent
Ohmi et al.

(10) Patent No.: US 7,842,956 B2
(45) Date of Patent: Nov. 30, 2010

(54) NITRIDE SEMICONDUCTOR LASER ELEMENT AND FABRICATION METHOD THEREOF

(75) Inventors: Susumu Ohmi, Mihara (JP); Kunihiro Takatani, Nara (JP); Fumio Yamashita, Nara (JP); Mototaka Taneya, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 374 days.

(21) Appl. No.: 11/636,570

(22) Filed: Dec. 11, 2006

(65) Prior Publication Data

US 2007/0131960 A1 Jun. 14, 2007

(30) Foreign Application Priority Data

Dec. 9, 2005 (JP) .............................. 2005-355574

(51) Int. Cl.
*H01L 27/15* (2006.01)
*H01L 29/26* (2006.01)

(52) U.S. Cl. .............................. 257/79; 257/12; 257/14; 257/22; 257/97; 257/101; 257/103; 257/E29.079; 257/E33.005; 257/E33.023; 372/39; 372/45.01; 372/46.01

(58) Field of Classification Search ................... 257/12, 257/14, 22, 79, 97, 101, 103, E29.079, E33.005, 257/E33.023; 372/39, 45.01, 46.01
See application file for complete search history.

(56) References Cited

U.S. PATENT DOCUMENTS

| | | | | |
|---|---|---|---|---|
| 6,677,173 | B2 * | 1/2004 | Ota | ............................. 438/22 |
| 7,072,374 | B2 | 7/2006 | Matsumura | |
| 7,496,124 | B2 * | 2/2009 | Kozaki et al. | ................. 372/39 |
| 2004/0238810 | A1 * | 12/2004 | Dwilinski et al. | ............. 257/12 |

FOREIGN PATENT DOCUMENTS

| | | |
|---|---|---|
| JP | 11-330610 | 11/1999 |
| JP | 2000-114664 | 4/2000 |
| JP | 2006-237475 | 9/2006 |

* cited by examiner

*Primary Examiner*—Dao H Nguyen
(74) *Attorney, Agent, or Firm*—Harness, Dickey & Pierce, PLC

(57) ABSTRACT

On a nitride semiconductor layered portion formed on a substrate, there are formed an insulating film and a p-side electrode in this order. Furthermore, an end portion electrode protection layer is formed above the p-side electrode, around a position where cleavage will take place.

14 Claims, 13 Drawing Sheets

NITRIDE SEMICONDUCTOR LASER ELEMENT AND FABRICATION METHOD THEREOF

This nonprovisional application claims priority under 35 U.S.C. § 119(a) on Patent Application No. 2005-355574 filed in Japan on Dec. 9, 2005, the entire contents of which are hereby incorporated by reference.

BACKGROUND OF THE INVENTION

1. Field of the Invention

The present invention relates to a nitride semiconductor laser element that is less prone to uneven current injection near a cavity end face and that is thus less prone to a resulting abnormality in the current-optical output characteristic.

2. Description of Related Art

In a nitride semiconductor laser element having a ridge stripe-shaped waveguide, when an electrode is formed above a nitride semiconductor layered portion, it is commonly formed with the following layers interposed in between: a waveguide formed on the top surface of the nitride semiconductor layered portion, which is formed on a substrate; and an insulating protection film having an opening above the waveguide. As an example of a nitride semiconductor laser element so structured, the one proposed in JP-A-H11-330610 is shown in FIG. 20.

FIG. 20 is a cross-sectional view of the nitride semiconductor laser element 100 cut in the direction perpendicular to a ridge stripe-shaped waveguide region 115, that is, in the direction parallel to cavity end faces. The nitride semiconductor laser element 100 has, on a nitride semiconductor substrate 106 exhibiting n-type conductivity, the following layers laid one after another: an n-type crack prevention layer 107; an n-type clad layer 108; a light guide layer 109; an active layer 110; a p-type cap layer 111; a light guide layer 112; a p-type clad layer 113; and a p-type contact layer 114. Part of these layers and of the nitride semiconductor substrate 106 is then etched away to form the waveguide region 115 in the shape of an elevated stripe. Over the top surface of the nitride semiconductor substrate 106 and over the side surfaces of the waveguide region 115, there is formed, as an insulating protection film, a first protection film 104 having an opening above the waveguide region 115. The waveguide region 115 and a region nearby are coated with a p-type electrode 101. Over the part of the top surface of the nitride semiconductor substrate 106 other than where the p-type electrode 101 is located, there is formed a second protection film 105. On the p-type electrode 101 and the second protection film 105, a pad electrode 102 is formed. On the bottom surface of the nitride semiconductor substrate 106, an n-type electrode 103 is formed.

In this conventional nitride semiconductor laser element 100, the nitride semiconductor substrate 106 along with the different layers formed thereon is cleaved to produce cavity end faces. When this is done, there is a risk of the p-type electrode 101 exfoliating from the p-type contact layer 114 at a cavity end face. Where the p-type electrode 101 has exfoliated, no current is injected from the p-type electrode 101 into the different layers formed on the nitride semiconductor substrate 106. Thus, uneven current injection occurs, possible leading to a defect in the current-optical output characteristic.

SUMMARY OF THE INVENTION

An object of the present invention is to provide a nitride semiconductor laser element that is less prone to exfoliation of a p-type electrode from a nitride semiconductor layer at the time of cleaving of a nitride semiconductor substrate having a p-side electrode, the nitride semiconductor layer, etc. formed thereon, and that is thus less prone to uneven current injection.

To achieve the above object, according to one aspect of the present invention, a nitride semiconductor laser element is provided with: a substrate; a nitride semiconductor layered portion having a plurality of nitride semiconductor layers laid one after another on the substrate, and having a ridge stripe-shaped waveguide provided therein; an insulating layer formed on the nitride semiconductor layered portion and having an opening above the waveguide; a first electrode provided above the waveguide and the insulating layer; and a cavity end face perpendicular to the length direction of the waveguide. Moreover, above the first electrode, an end portion electrode protection layer is provided of which an end face is flush with the end face of the cavity. Here, the first electrode can be used as a p-side electrode or as a p-side contact electrode.

According to the present invention, in the nitride semiconductor laser element structured as described above, the end portion electrode protection layer may be contiguous with the first electrode, and is contiguous with the insulating layer on at least one side of the first electrode with respect to the direction perpendicular to the length direction of the waveguide.

According to the present invention, in the nitride semiconductor laser element structured as described above, the end portion electrode protection layer and the insulating layer may each be composed of one or more layers; moreover, the layer of the end portion electrode protection layer contiguous with the first electrode and the layer of the insulating layer contiguous with the first electrode may be formed of the same material.

According to the present invention, in the nitride semiconductor laser element structured as described above, the end portion electrode protection layer and the insulating layer may each be composed of two or more layers, and may have symmetric layer structures with respect to the first electrode.

According to the present invention, in the nitride semiconductor laser element structured as described above, the first electrode may have a thickness of 30 Å or more but 1 000 Å or less.

According to the present invention, in the nitride semiconductor laser element structured as described above, a second electrode may be provided above the first electrode and the insulating layer.

According to the present invention, in the nitride semiconductor laser element structured as described above, a second electrode may be provided above the end portion electrode protection layer, the first electrode, and the insulating layer. Here, the second electrode may be used as a pad electrode.

According to the present invention, in the nitride semiconductor laser element structured as described above, the second electrode may have an end face thereof located inward of the end face of the cavity.

According to the present invention, in the nitride semiconductor laser element structured as described above, the second electrode may have a wire bonding portion to which a wire is bonded to electrically connect the nitride semiconductor laser element to outside; moreover, the second electrode may have, in the wire bonding portion, a reinforcement layer below the second electrode, the reinforcement layer having the same layer structure as the end portion electrode protection layer.

According to another aspect of the present invention, a method of fabricating a nitride semiconductor laser element involves: a first step of laying a plurality of nitride semiconductor layers on a substrate, in order to form a nitride semiconductor layered portion; a second step of forming as a first mask layer a stripe-shaped mask layer on the top surface of the nitride semiconductor layered portion formed in the first step; a third step of etching away a top part of the nitride semiconductor layered portion that is not covered by the first mask layer formed in the second step, in order to form a ridge stripe-shaped waveguide in the nitride semiconductor layered portion; a fourth step of forming an insulating layer above the nitride semiconductor layered portion etched in the third step and above the first mask layer; a fifth step of removing, of the insulating layer formed in the fourth step, a part formed above the first mask layer along with the first mask layer, in order to form an opening in the insulating layer; a sixth step of forming a first electrode above the insulating layer having the opening formed therein in the fifth step and above the nitride semiconductor layered portion; a seventh step of forming a second mask layer above the insulating layer and above the first electrode formed in the sixth step other than in a region near a cleaving position perpendicular to the length direction of the waveguide; an eighth step of forming an end portion electrode protection layer in a region where the second mask layer, the first electrode, and the insulating layer are exposed; a ninth step of removing, of the end portion electrode protection layer formed in the eighth step, a part formed above the second mask layer and the second mask layer; and a tenth step of cleaving, at the cleaving position perpendicular to the length direction of the waveguide and including a part of the end portion electrode protection layer that remains after the second mask layer is removed in the ninth step, the substrate and the nitride semiconductor layered portion along with the first electrode, the insulating layer, and the end portion electrode protection layer.

According to the present invention, in the nitride semiconductor laser element fabrication method described above, in the tenth step, a second electrode may be provided above the end portion electrode protection layer, the first electrode, and the insulating layer and, at the cleaving position perpendicular to the length direction of the waveguide and including the end portion electrode protection layer, the substrate and the nitride semiconductor layered portion may be cleaved along with the insulating layer, the first electrode, and the end portion electrode protection layer.

According to the present invention, in the nitride semiconductor laser element fabrication method described above, in the tenth step, a second electrode may be provided above the end portion electrode protection layer, the first electrode, and the insulating layer other than in the region near the cleaving position perpendicular to the length direction of the waveguide; moreover, at the cleaving position perpendicular to the length direction of the waveguide and including the end portion electrode protection layer, the substrate and the nitride semiconductor layered portion may be cleaved along with the insulating layer, the first electrode, and the end portion electrode protection layer.

According to the present invention, in the nitride semiconductor laser element fabrication method described above, in the seventh step, the second mask layer is formed above the insulating layer and above the first electrode formed in the sixth step other than in the region near the cleaving position perpendicular to the length direction of the waveguide and other than in a region below a position serving as a wire bonding portion to which a wire is bonded to electrically connect the nitride semiconductor laser element to outside; moreover, in the tenth step, the second electrode may be formed also at the position serving as the wire bonding portion.

DETAILED DESCRIPTION OF PREFERRED EMBODIMENTS

First Embodiment

Figure 1:
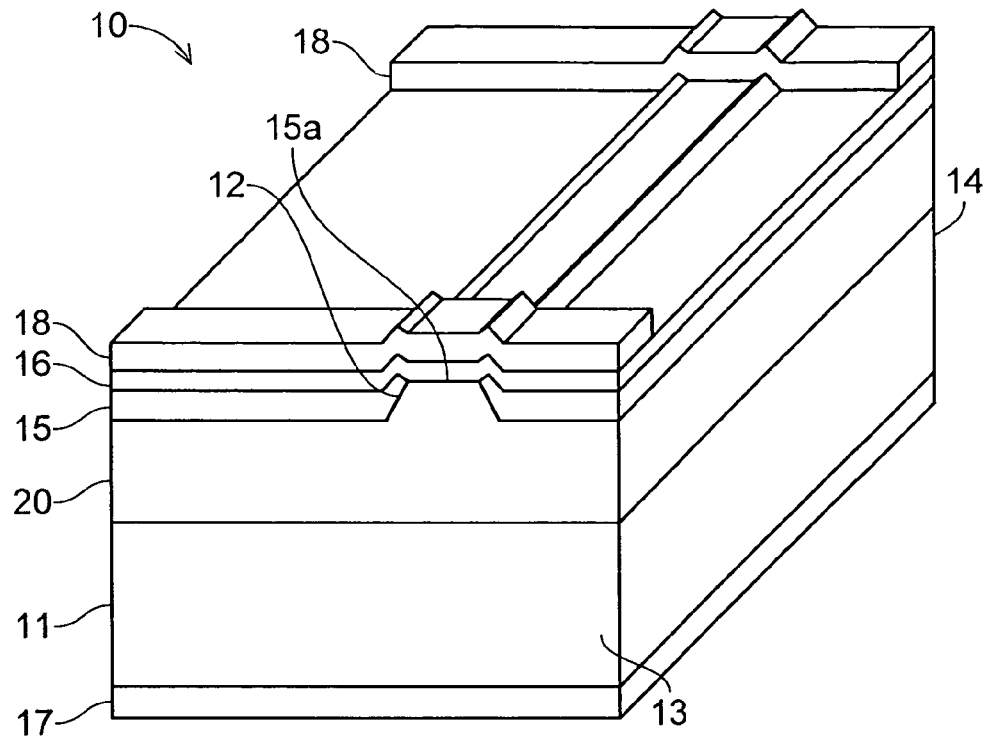
FIG. 1 is a perspective view of the nitride semiconductor laser element of a first embodiment of the present invention.
Figure 2:
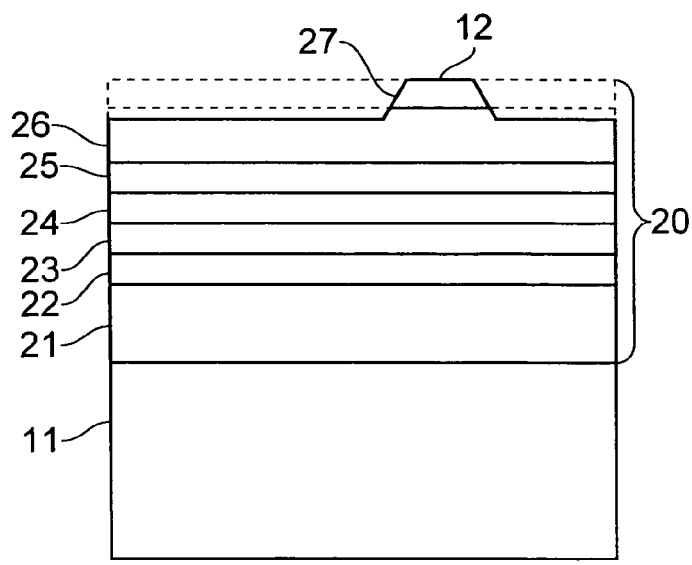
FIG. 2 is a partial front view of a portion around a nitride semiconductor layered portion in the first embodiment.

A first embodiment of the present invention will be described below with reference to FIGS. 1 to 10. FIG. 1 is a perspective view of the nitride semiconductor laser element of the first embodiment; FIG. 2 is a partial front view of a portion around a nitride semiconductor layered portion in the first embodiment; FIGS. 3 to 9 are partial cross-sectional and perspective views showing the fabrication method of the nitride semiconductor laser element of the first embodiment; and FIG. 10 is a partial plan view of a wafer in the first embodiment.

As shown in FIG. 1, the nitride semiconductor laser element 10 of the first embodiment has a nitride semiconductor layered portion 20 formed on an n-type GaN substrate 11. As shown in FIG. 2, the nitride semiconductor layered portion 20 has the following layers laid one after another in the order named from the n-type GaN substrate 11 side thereof: an n-type GaN layer 21; an n-type AlGaN clad layer 22; an n-type GaN light waveguide layer 23; an active layer 24 having an InGaN multiple quantum well structure; a p-type GaN light waveguide layer 25; a p-type AlGaN clad layer 26; and p-type GaN contact layer 27.

In the nitride semiconductor layered portion 20, a top part of the p-type AlGaN clad layer 26 and a part of the p-type GaN contact layer 27 are removed as indicated by broken lines in FIG. 2 to form a 2 μm wide ridge stripe-shaped waveguide 12. Above the nitride semiconductor layered portion 20, an insulating film 15 is provided that has an opening 15a formed in a part thereof corresponding to the top surface of the waveguide 12. The insulating film 15 has, laid one after the other in the order named from the nitride semiconductor layered portion 20 side, 1 500 Å thick $SiO_2$ and 500 Å thick $TiO_2$. Above the insulating film 15 and on the top surface of the waveguide 12, a p-side electrode 16 is provided that is formed of 500 Å thick Pd. The p-side electrode 16 forms ohmic contact with the top surface of the waveguide 12 through the opening 15a of the insulating film 15. Cleavage surfaces 13 and 14 form cavity end faces, the former being the one through which laser light is emitted and the latter being the one on which laser light is reflected. Moreover, along the cleavage surfaces 13 and 14, there is formed an end portion electrode protection layer 18 formed of 500 Å thick $TiO_2$ and 1 500 Å thick $SiO_2$. Furthermore, on the bottom surface of the n-type GaN substrate 11, there is provided an n-side electrode 17 that has, laid one after the other in the order named from the n-type GaN substrate 11 side, 500 Å thick Ti and 2 000 Å thick Al.

Next, the fabrication procedure of the nitride semiconductor laser element 10 of the first embodiment will be described with reference to FIGS. 2 to 10.

Figure 3:
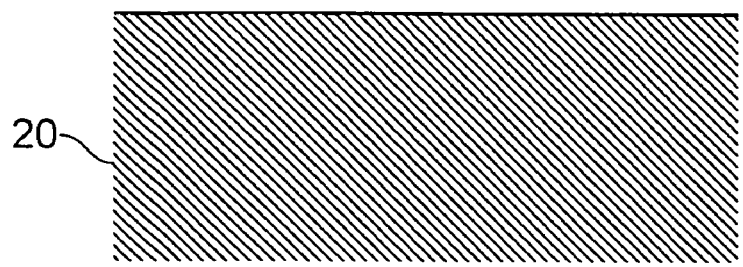
FIG. 3 is a partial cross-sectional view showing the fabrication method of the nitride semiconductor laser element of the first embodiment.

First, as shown in FIGS. 2 and 3, on an n-type GaN substrate 11 (unillustrated in FIG. 3), a nitride semiconductor layered portion 20 is formed by a crystal growth process such as an MOCVD (metal organic chemical vapor deposition) process or a MBE (molecular beam epitaxy) process.

Figure 4:
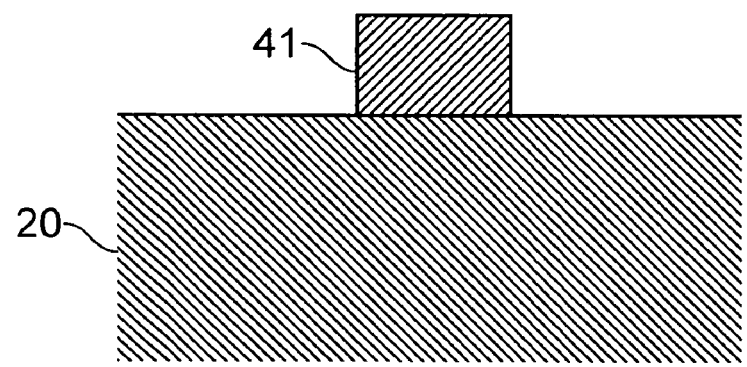
FIG. 4 is a partial cross-sectional view showing the fabrication method of the nitride semiconductor laser element of the first embodiment.
Figure 5:
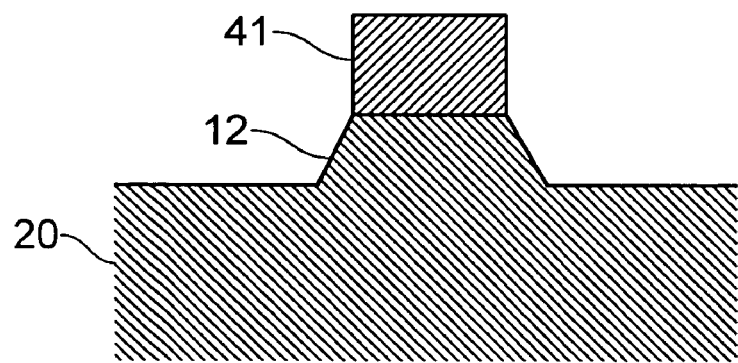
FIG. 5 is a partial cross-sectional view showing the fabrication method of the nitride semiconductor laser element of the first embodiment.

Next, as shown in FIG. 4, as a first resist mask 41, a 2 μm wide stripe-shaped resist mask is formed on the surface of the nitride semiconductor layered portion 20. Subsequently, as shown in FIG. 5, by a reactive ion etching process using the first resist mask 41 as a mask, the nitride semiconductor layered portion 20 is etched from its top surface down to the middle of a p-type AlGaN clad layer 26 to form a waveguide 12 (see FIG. 2). Used as a process gas here is a chlorine-based gas such as $Cl_2$, $SiCl_4$, or $BCl_3$.

Figure 6:
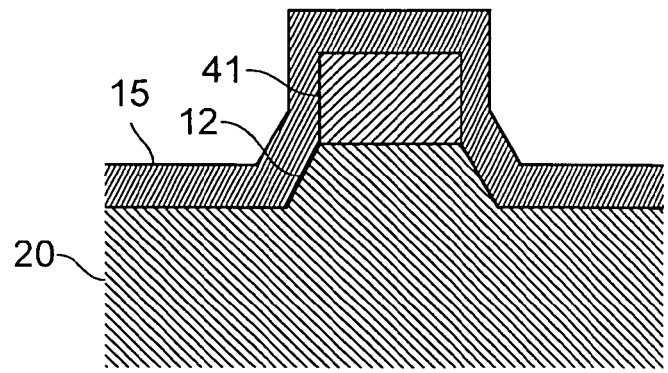
FIG. 6 is a partial cross-sectional view showing the fabrication method of the nitride semiconductor laser element of the first embodiment.
Figure 7:
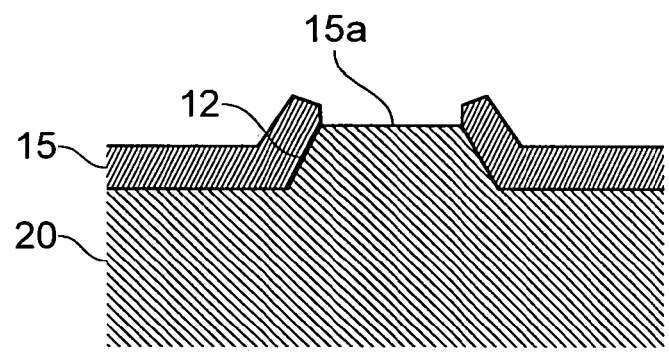
FIG. 7 is a partial cross-sectional view showing the fabrication method of the nitride semiconductor laser element of the first embodiment.
Figure 8:
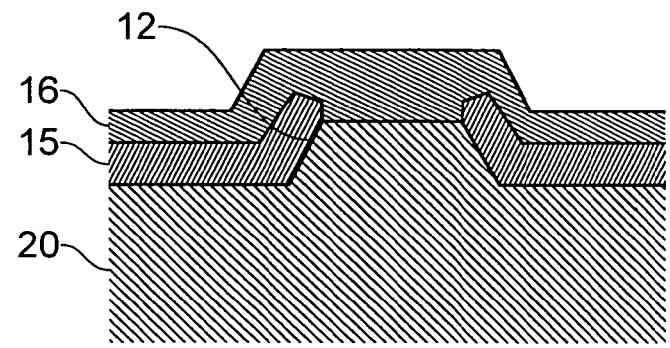
FIG. 8 is a partial cross-sectional view showing the fabrication method of the nitride semiconductor laser element of the first embodiment.

Next, as shown in FIG. 6, over the entire top surface of the nitride semiconductor layered portion 20 including the first resist mask 41, 1 500 Å thick $SiO_2$ and 500 Å thick $TiO_2$ are laid in this order by an electron beam vapor-deposition process to form an insulating film 15. Subsequently, as shown in FIG. 7, by a lift-off process, the insulating film 15 above the first resist mask 41 and the first resist mask 41 are removed so that a opening 15a is formed in the insulating film 15. After the formation of the opening 15a, as shown in FIG. 8, on the top surface of the insulating film 15 and the waveguide 12, a p-side electrode 16 formed of 500 Å thick Pd is formed.

Figure 9:
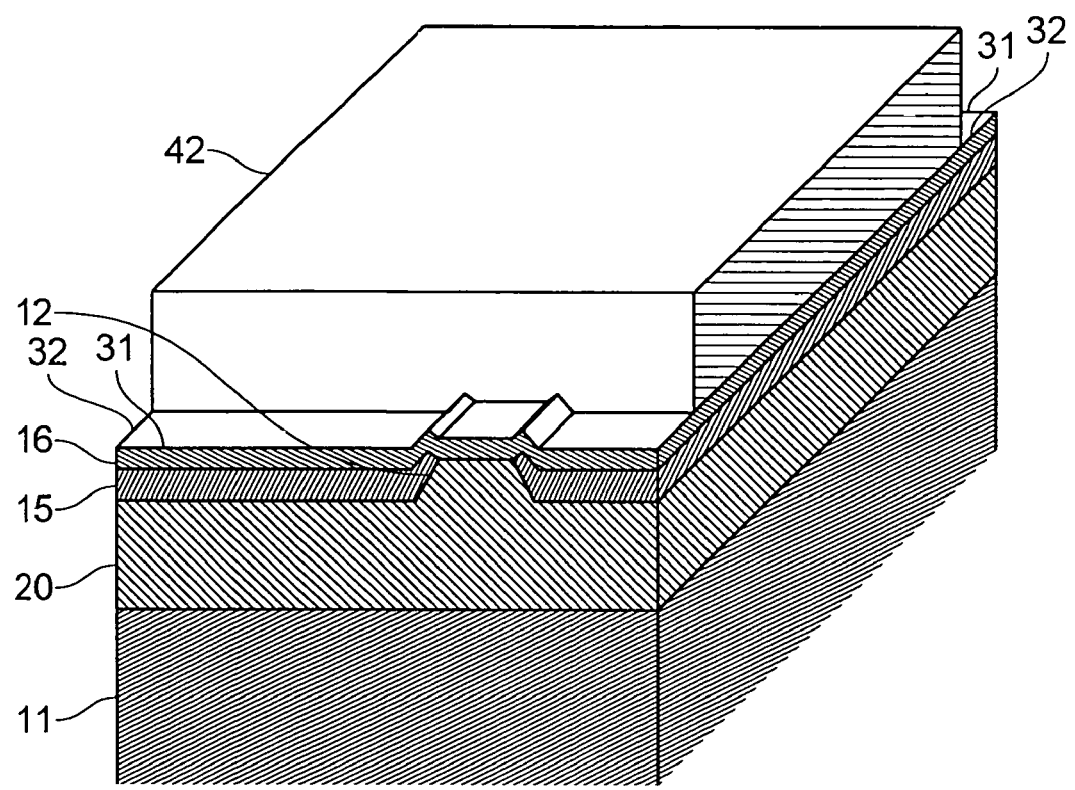
FIG. 9 is a partial perspective view showing the fabrication method of the nitride semiconductor laser element of the first embodiment.
Figure 10:
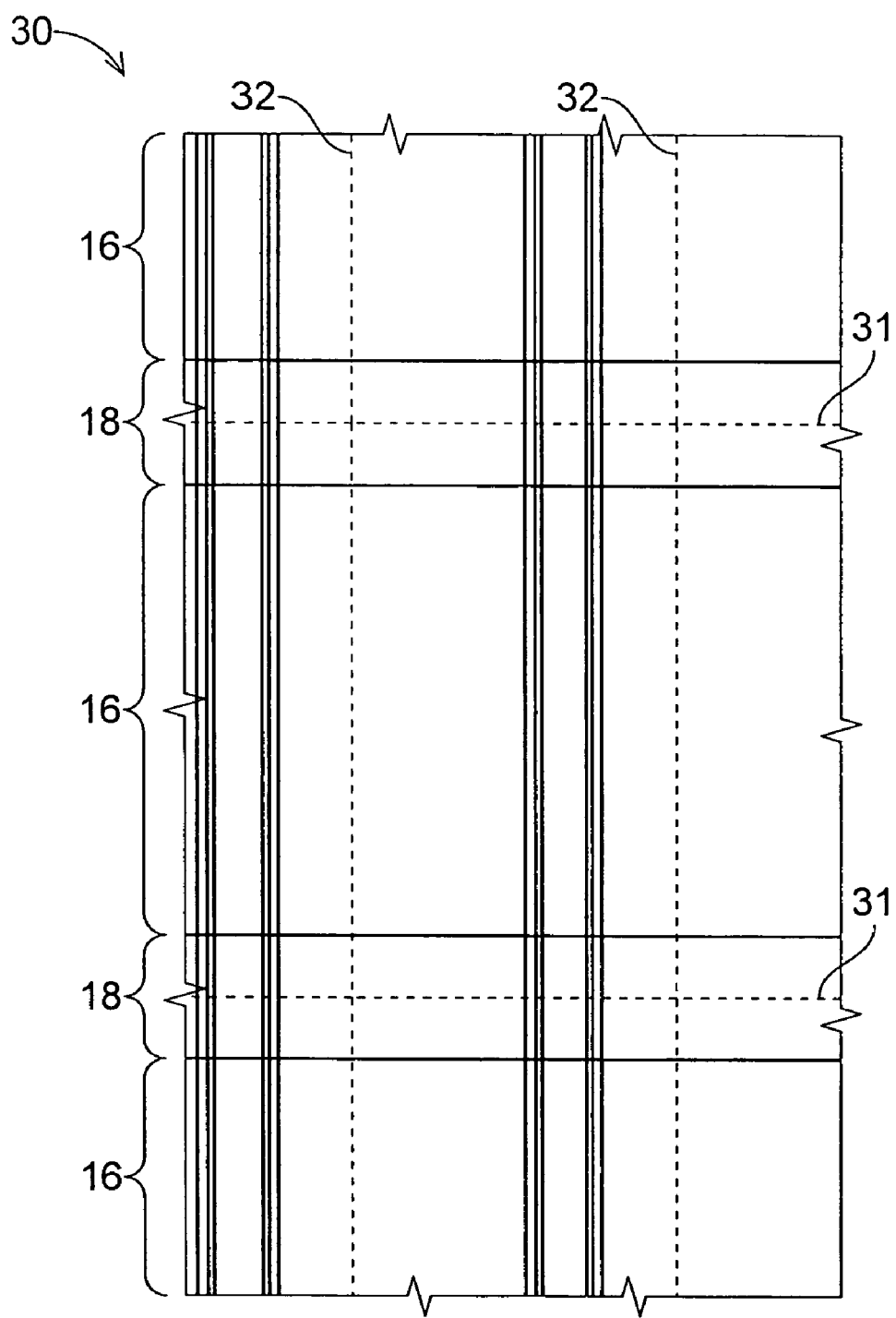
FIG. 10 is a partial plan view of a wafer in the first embodiment.

Next, as shown in FIG. 9, above the insulating film 15, a second resist mask 42 is formed so as to cover the p-side electrode 16. Here, the second resist mask 42 is formed 50 μm inward of cleaving positions 31 at which cleavage surfaces 13 and 14 will appear after cleaving.

After the formation of the second resist mask 42, above the second resist mask 42 and above where the insulating film 15 is exposed, 500 Å thick $TiO_2$ and 1 500 Å thick $SiO_2$ are formed in this order. Then, by use of an organic solvent, the second resist mask 42 and the $TiO_2$ and $SiO_2$ formed above it are removed. Now, a wafer 30 as shown in FIG. 10 is complete. The $TiO_2$ and $SiO_2$ left on the p-side electrode 16 in this way serves as an end portion electrode protection layer 18. Thereafter, the bottom surface of the n-type GaN substrate 11, that is, the surface of the n-type GaN substrate 11 opposite from the side thereof where the nitride semiconductor layered portion 20 is formed, is polished until the thickness equals about 100 microns, and then, over the entire bottom surface of the n-type GaN substrate 11, 500 Å thick Ti and 2 000 Å thick Al are formed by an electron beam vapor-deposition process to form an n-side electrode 17, which is shown in FIG. 1. Next, at the cleaving positions 31, the nitride semiconductor layered portion 20 and the n-type GaN substrate 11 are cleaved along with the end portion electrode protection layer 18, the insulating film 15, the p-side electrode 16, and the n-side electrode 17, so that the wafer 30 is split into bars. This produces a cleavage surface 13, which is a cavity end surface through which laser light is emitted, and a cleavage surface 14, which is a cavity end surface on which laser light is reflected. Lastly, the bars thus obtained are further split at splitting positions 32 to obtain the nitride semiconductor laser element 10 shown in FIG. 1.

With this structure, when the n-type GaN substrate 11 having the nitride semiconductor layered portion 20, the insulating film 15, the p-side electrode 16, and the n-side electrode 17 formed thereon—that is, the wafer 30—is cleaved, even though the p-side electrode 16 receives a stress that acts in such a direction as to cause the p-side electrode 16 to exfoliate from the p-type GaN contact layer 27, the p-side electrode 16 is less likely to exfoliate because it is held in position by the end portion electrode protection layer 18. Thus, the nitride semiconductor laser element 10 is less prone to uneven current injection, and is hence less prone to a defect in the current-optical output characteristic.

In the first embodiment, like the insulating film 15, the end portion electrode protection layer 18 has a two-layer structure of $SiO_2$ and $TiO_2$. The end portion electrode protection layer 18 and the insulating film 15 do not necessarily have to have the same material structure. The inventors of the present invention have found, however, that giving the end portion electrode protection layer 18 and the insulating film 15 the same material structure and thereby giving them equal hardness helps the p-side electrode 16 located between them split neatly along the cleavage surfaces 13 and 14.

Here, "having the same material structure" means either (1) that the end portion electrode protection layer 18 and the insulating film 15 are each formed of a single layer and in addition that they are both formed of the same material or (2) that at least one of the end portion electrode protection layer 18 and the insulating film 15 is formed of two or more layers and in addition that the layer of the end portion electrode protection layer 18 contiguous with the p-side electrode 16 and the layer of the insulating film 15 contiguous with the p-side electrode 16 are formed of the same material.

In either of these cases (1) and (2), the p-side electrode 16 splits more neatly along the cleavage surfaces 13 and 14 than otherwise. In particular in a case where, as in the first embodiment, the insulating film 15 and the end portion electrode protection layer 18 are structured symmetrically in material and thickness with respect to the p-side electrode 16, the p-side electrode 16 splits most neatly along the cleavage surfaces 13 and 14.

When the insulating film 15 and the end portion electrode protection layer 18 are structured symmetrically with respect to the p-side electrode 16, it is preferable to pay attention to the adhesion at the interface between the insulating film 15 and the p-side electrode 16 and the adhesion at the interface between the p-side electrode 16 and the end portion electrode protection layer 18. If the adhesion at least one of these interfaces is insufficient, when cleaving is performed at the cleaving positions 31, the structure above the interface at which the adhesion, and hence the junction strength, is insufficient exfoliates. This makes it impossible to achieve the intended effect of splitting the p-side electrode 16 neatly along the cleavage surfaces 13 and 14 without causing it to exfoliate from the insulating film 15 and the p-type GaN contact layer 27.

Instead of the p-side electrode 16 being formed over the entire top surface of the wafer 30 shown in FIG. 1, however, the p-side electrode 16 may be formed only on the ridge stripe-shaped waveguide 12 and around it. This helps greatly alleviate the restrictions on the interrelation between the p-side electrode 16 and the insulating film 15. This will be described in connection with the second embodiment.

Second Embodiment

Figure 11:
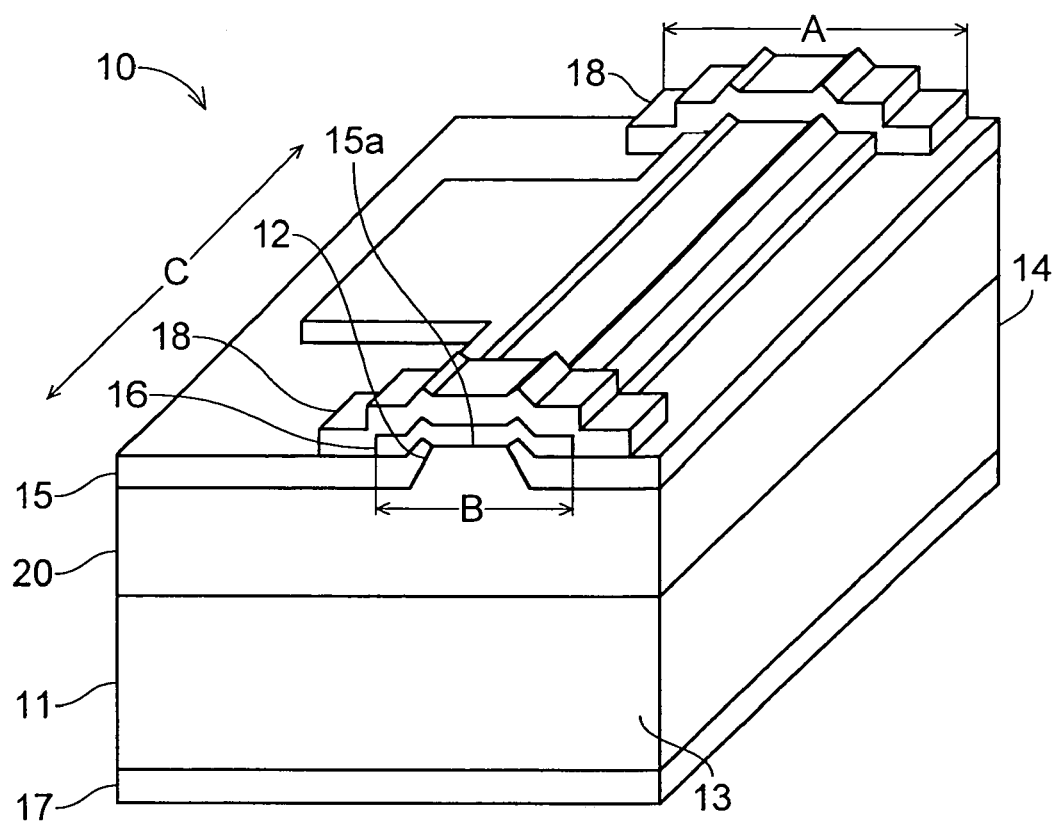
FIG. 11 is a perspective view of the nitride semiconductor laser element of a second embodiment of the present invention.
Figure 12:
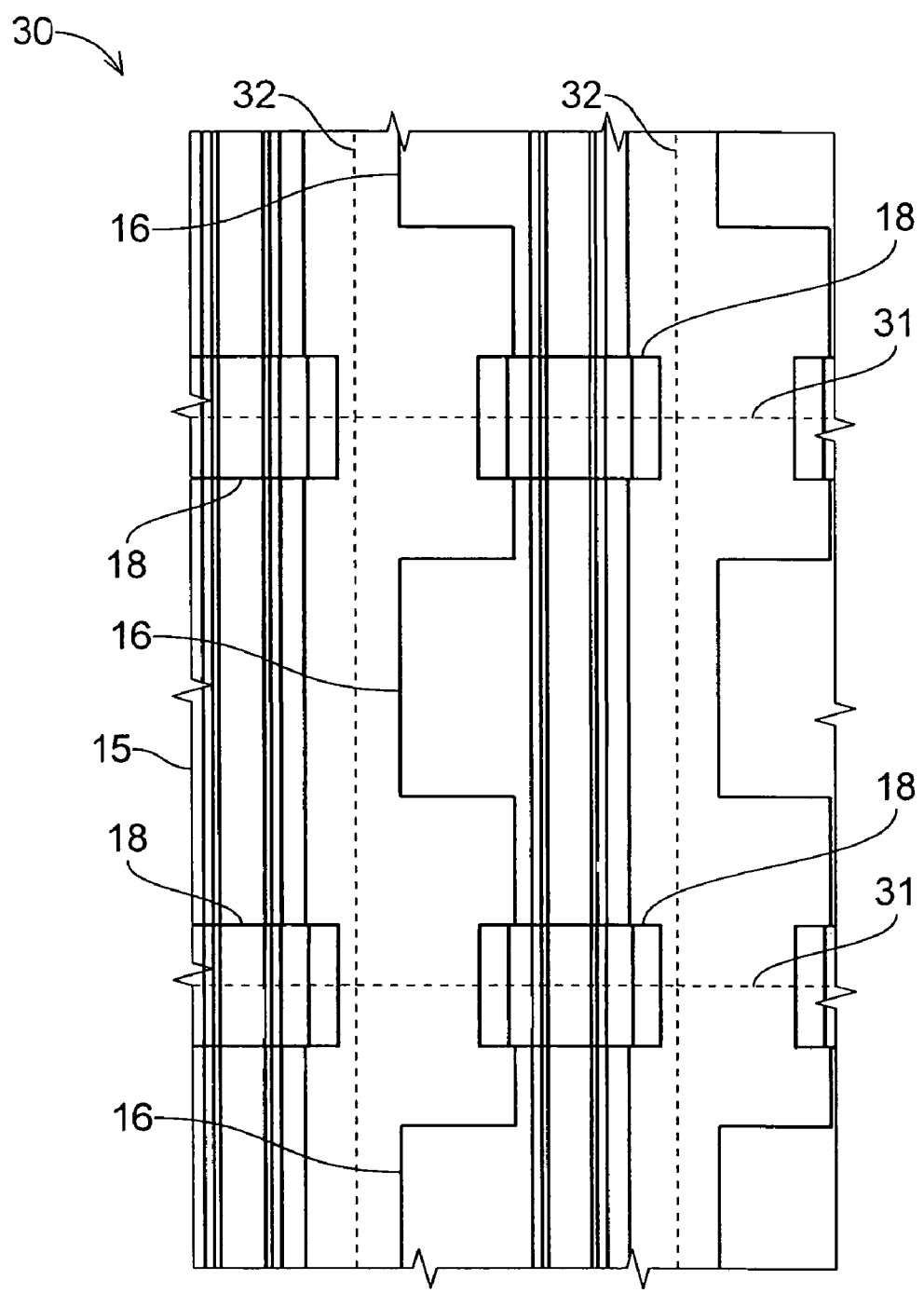
FIG. 12 is a partial plan view of a wafer in the second embodiment.

A second embodiment of the present invention will be described below with reference to FIGS. 11 and 12. FIG. 11 is a perspective view of the nitride semiconductor laser element of the second embodiment, and FIG. 12 is a partial plan view of a wafer in the second embodiment. The second embodiment is the same as the first embodiment except that a p-side electrode is provided not over the entire surface of a top part of the substrate but only on and around a waveguide; therefore such parts as find their counterparts between these embodiments will be identified with common reference numerals. The fabrication method here also is largely the same as in the first embodiment.

As shown in FIG. 11, in the nitride semiconductor laser element 10 of the second embodiment, a nitride semiconductor layered portion 20 is formed on an n-type GaN substrate 11. The nitride semiconductor layered portion 20 is structured in the same manner as in the first embodiment, that is, as shown in FIG. 2. In the nitride semiconductor layered portion 20, a 2 μm wide ridge stripe-shaped waveguide 12 is formed, and, above the nitride semiconductor layered portion 20, an insulating film 15 is provided that has an opening 15*a* formed in a part thereof corresponding to the top surface of the waveguide 12. The insulating film 15 is formed of 3 500 Å thick $SiO_2$. Moreover, on the top surface of the waveguide 12 and around it, a p-side electrode 16 that is formed of 500 Å thick Pd is provided so as to form ohmic contact with the top surface of the waveguide 12 through the opening 15*a* of the insulating film 15. Moreover, on the bottom surface of the n-type GaN substrate 11, there is provided an n-side electrode 17 that has, laid one after the other in the order named from the n-type GaN substrate 11 side, 500 Å thick Ti and 2 000 Å thick Al.

The width of the p-side electrode 16 is 20 μm at the emission-side and reflection-side cleavage surfaces 13 and 14, and 200 μm in a central part of the nitride semiconductor laser element 10 away from the cleavage surfaces 13 and 14. While the p-side electrode 16 continuously covers the top surface of the waveguide 12 and the 9 μm wide regions contiguously on both sides thereof, it does not cover the entire top surface of the nitride semiconductor laser element 10 as in the first embodiment shown in FIG. 1. The wider portion of the p-side electrode 16 in the central part of the nitride semiconductor laser element 10 serves as a region to which, for example, a gold wire is bonded to electrically connect the nitride semiconductor laser element 10 to outside. The p-side electrode 16 so shaped can be easily formed by, for example, a lift-off process.

Moreover, as shown in FIG. 11, along the cleavage surfaces 13 and 14, there is formed an end portion electrode protection layer 18 formed of 3 500 Å thick $SiO_2$. The width of the end portion electrode protection layer 18 ("A" in FIG. 11) is larger than the width of the p-side electrode 16 ("B" in FIG. 11) at the cleavage surfaces 13 and 14; specifically, in this embodiment, the width of the end portion electrode protection layer 18 there is set to be 100 μm. Thus, the end portion electrode protection layer 18 joins directly to the insulating film 15 outside the p-side electrode 16. The length of the end portion electrode protection layer 18 in the waveguide length direction (the direction indicated by "C" in FIG. 11) is 50 μm both at the emission side and at the reflection side. The end portion electrode protection layer 18 is formed before the n-type GaN substrate 11 having the nitride semiconductor layered portion 20, the insulating film 15, the p-side electrode 16, and the n-side electrode 17 formed thereon is cleaved at the cleaving positions 31. Thus, when the wafer 30 is cleaved into bars, the end portion electrode protection layer 18 is, along with the n-type GaN substrate 11 etc., split into the shape shown in FIG. 11.

In the second embodiment, unlike the first embodiment, the insulating film 15 and the end portion electrode protection layer 18 are each formed of a single layer of $SiO_2$. The single-layer structure is easier to fabricate than the two-layer structure of $SiO_2$ and $TiO_2$ adopted in the first embodiment. Also to be noted is the fact that the interface between the insulating film 15 and the p-side electrode 16 and the interface between the p-side electrode 16 and the end portion electrode protection layer 18 are both formed with $SiO_2$ and Pd laid contiguous with each other.

In general, $SiO_2$ and Pd show poor adhesion with each other, and easily exfoliate from each other. Accordingly, in a case where the two interfaces are both formed with $SiO_2$ and Pd laid contiguous with each other as described above, if a structure is adopted in which the end portion electrode protection layer 18 joins only to the p-side electrode 16 as in the first embodiment, when cleaving is performed, there is a risk of exfoliation of the structure above at least one of the two interfaces. When the p-side electrode 16 is formed on the insulating film 15, interdiffusion between them can be promoted by setting the film formation temperature at, for example, 200° C.; to a certain degree, this helps increase the junction strength at the interface between the insulating film 15 and the p-side electrode 16. When the end portion electrode protection layer 18 is formed on the p-side electrode 16, however, the second resist mask 42 has already been formed as described with reference to FIG. 9 in connection with the first embodiment. Thus, raising the film formation temperature causes burning-on of the second resist mask 42. This makes it impossible to perform film formation at a temperature high enough to secure sufficient adhesion, that is, junction strength, between the p-side electrode 16 and the end portion electrode protection layer 18. For this reason, the interface between the p-side electrode 16 and the end portion electrode protection layer 18 is more liable to pose a problem.

By contrast, in the second embodiment, the end portion electrode protection layer 18 and the insulating film 15 are both formed of $SiO_2$, and the former joins directly to the latter outside the p-side electrode 16. The junction strength of $SiO_2$ with itself is far higher than that at the interface between the insulating film 15 and the p-side electrode 16 and that at the interface between the p-side electrode 16 and the end portion electrode protection layer 18. Thus, when cleaving is performed, the p-side electrode 16 is far less likely to exfoliate from the p-type GaN contact layer 27.

In the second embodiment, it is preferable that the end portion electrode protection layer 18 and the insulating film 15 be formed of the same material, like $SiO_2$ mentioned above. It is, however, also possible to form them with different materials. In that case, the materials need to be so combined that the junction strength at the interface at which the end portion electrode protection layer 18 and the insulating film 15 directly join together is higher than both the junction strength at the interface between the insulating film 15 and the p-side electrode 16 and the junction strength at the interface between the p-side electrode 16 and the end portion electrode protection layer 18.

In the second embodiment, the end portion electrode protection layer 18 is formed only on the p-side electrode 16 and in regions on both sides thereof along the cleavage surfaces 13 and 14. It is, however, also possible to form it continuously along the cleavage surfaces 13 and 14 as in the first embodiment. In either case, it is possible to obtain the intended effect of the present invention, that is, the effect of neatly splitting the p-side electrode 16 along the cleavage surfaces 13 and 14 without causing it to exfoliate from the insulating film 15 and the p-type GaN contact layer 27. In a case where the cleaving positions 31 are scribed with a needle before the wafer 30 is cleaved, however, if the end portion electrode protection layer 18 is formed at the cleaving positions 31, the needle may not sink sufficiently deep into the insulating film 15. When this is the case, even when the wafer 30 is split along the scribed cleaving positions 31, the cleavage surfaces 13 and 14 may not be formed smooth. In that case, it is advisable to form the end portion electrode protection layer 18 only on and around the p-side electrode 16 as in the second embodiment and, in particular near the cleavage surfaces 13 and 14, in such a way that the p-side electrode 16 is surrounded by the end portion electrode protection layer 18, the insulating film 15, and the p-type GaN contact layer 27, so that the needle is put in the part of the insulating film 15 other than where the end portion electrode protection layer 18 is formed.

In the nitride semiconductor laser element of the second embodiment shown in FIG. 11, the end portion electrode protection layer 18 and the insulating film 15 directly join together on both sides of the ridge stripe-shaped waveguide 12. This, however, does not mean that such junctions are necessary on both sides in the device in its finished form; they are necessary on both sides when the wafer 30 is split into bars.

Figure 13:
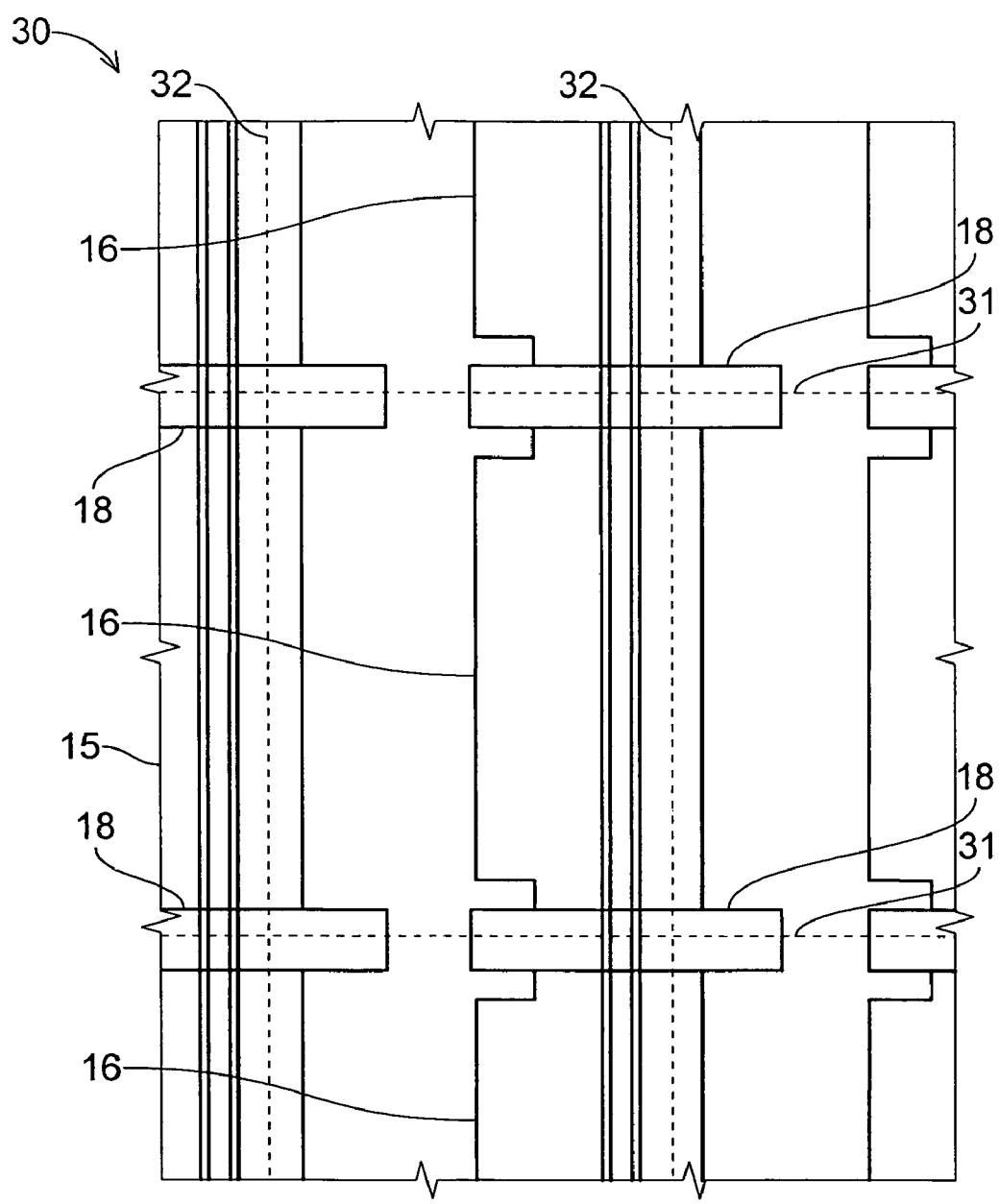
FIG. 13 is a partial plan view of another wafer in the second embodiment.
Figure 14:
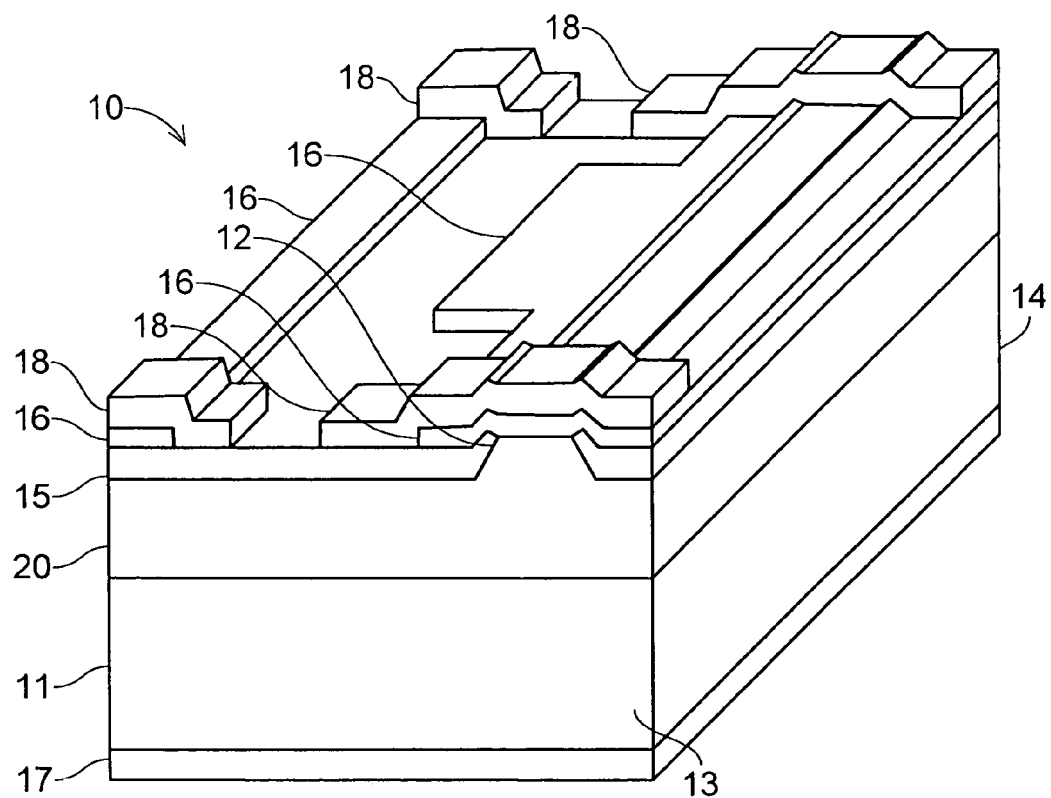
FIG. 14 is a perspective view of the nitride semiconductor laser element of a second embodiment of the present invention.

FIG. 13 is a partial plan view of another wafer in the second embodiment. In the wafer 30 shown in FIG. 13, the splitting positions 32 indicated by broken lines in the previously described wafer 30 shown in FIG. 12 are so modified as to be located closer to the ridge stripe-shaped waveguide 12. With this design, in the nitride semiconductor laser element 10 in its finished form shown in FIG. 14, the end portion electrode protection layer 18 and the insulating film 15 directly join together on only one side of the ridge stripe-shaped waveguide 12, specifically only on the left-hand side of the waveguide 12 as viewed in FIG. 14. It is, however, before splitting is performed at the splitting positions 32 that the nitride semiconductor layered portion 20 and the n-type GaN substrate 11 are cleaved at the cleaving positions 31 indicated by broken lines in FIG. 13 and thereby the wafer 30 is split into bars. Thus, when cleaving is performed at the cleaving positions 31, as in the nitride semiconductor laser element of the second embodiment shown in FIG. 11, the end portion electrode protection layer 18 and the insulating film 15 directly join together on both sides of the ridge stripe-shaped waveguide 12. Thus, it is possible to obtain, unharmed in any way, the effect of the present invention, that is, the effect of neatly splitting the p-side electrode 16 along the cleavage surfaces 13 and 14 without causing it to exfoliate from the insulating film 15 and the p-type GaN contact layer 27.

In the first and second embodiments, the thickness of the p-side electrode 16 is 500 Å. The thickness of the p-side electrode 16, however, is not limited to 500 Å, but may be preferably in the range of 30 to 1 000 Å. This is because forming the p-side electrode 16 thinner than 30 Å makes it difficult to form ohmic contact with the p-type GaN contact layer 27; on the other hand, forming the p-side electrode 16 thicker than 1 000 Å may cause it to penetrate the end portion electrode protection layer 18, making it impossible for the end portion electrode protection layer 18 to serve to prevent the p-side electrode 16 from exfoliating from the p-type GaN contact layer 27. It is possible to form the end portion electrode protection layer 18 so thick as not to be penetrated by the p-side electrode 16. In that case, however, when the wafer 30 is cleaved, the end portion electrode protection layer 18 is unlikely to split in such a way as to be flush with the part of the cleavage surfaces 13 and 14 corresponding to the nitride semiconductor layered portion 20. Thus, after all, the p-side electrode 16 cannot be prevented from exfoliating from the p-type GaN contact layer 27.

With the thickness of the p-side electrode 16 restricted to 1 000 Å at most, however, when, for example, a gold wire is bonded to the p-side electrode 16 to electrically connect the nitride semiconductor laser element to outside, the gold wire may not be bonded with sufficient bonding strength, leading to exfoliation thereof. This inconvenience can be overcome by providing a pad electrode layer further on the p-side electrode 16. This will be described in connection with the third embodiment presented below.

Third Embodiment

Figure 15:
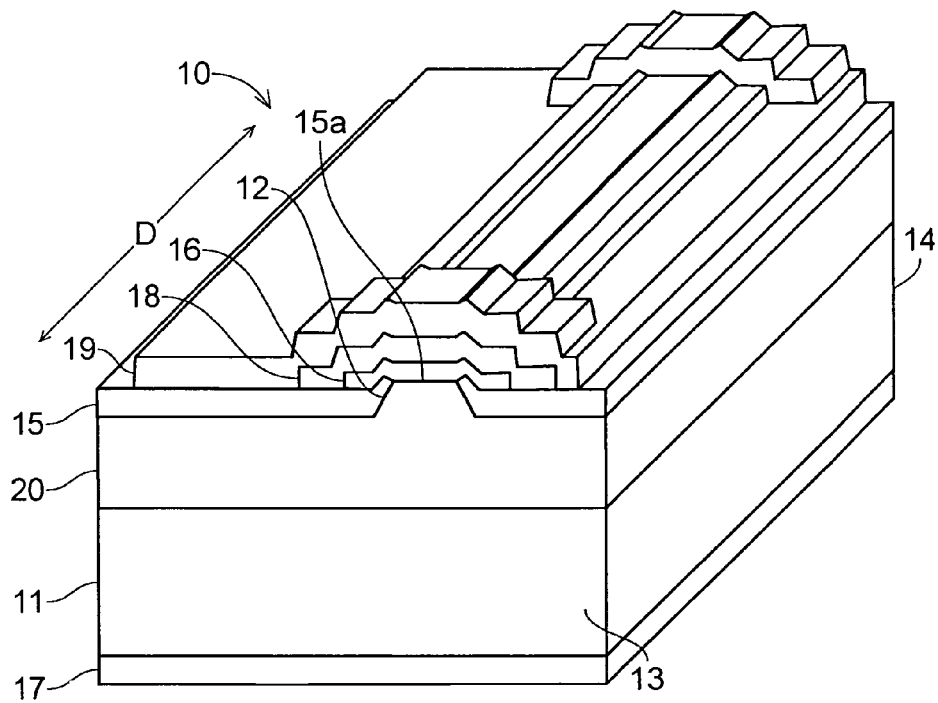
FIG. 15 is a perspective view of the nitride semiconductor laser element of a third embodiment of the present invention.

A third embodiment of the present invention will be described below with reference to FIG. 15. FIG. 15 is a perspective view of the nitride semiconductor laser element of the third embodiment. The third embodiment is the same as the second embodiment except that the p-side electrode is formed as a p-type contact electrode and that a pad electrode is provided on the insulating film, the p-side contact electrode, and the end portion electrode protection layer; therefore such parts as find their counterparts between these embodiments will be identified with common reference numerals. The fabrication method here is largely the same as in the first embodiment.

As shown in FIG. 15, in the nitride semiconductor laser element 10 of the third embodiment, a nitride semiconductor layered portion 20 is formed on an n-type GaN substrate 11. The nitride semiconductor layered portion 20 is structured in the same manner as in the first embodiment, that is, as shown in FIG. 2. In the nitride semiconductor layered portion 20, a 2 μm wide ridge stripe-shaped waveguide 12 is formed, and, above the nitride semiconductor layered portion 20, an insulating film 15 is provided that has an opening 15a formed in a part thereof corresponding to the top surface of the waveguide 12. The insulating film 15 is formed of 1 500 Å thick $SiO_2$ and 500 Å thick $TiO_2$. Moreover, on the top surface of the waveguide 12 and around it, a p-side contact electrode 16 that is formed of 500 Å thick Pd is provided so as to form ohmic contact with the top surface of the waveguide 12 through the opening 15a of the insulating film 15. Whereas the p-side electrode 16 in the second embodiment has a wider portion in a central part of the nitride semiconductor laser element 10, the p-side contact electrode 16 here may be formed with a uniform width.

Moreover, as shown in FIG. 15, along the cleavage surfaces 13 and 14, there is formed an end portion electrode protection layer 18 formed of 500 Å thick $TiO_2$ and 1 500 Å thick $SiO_2$. The width of the end portion electrode protection layer 18 is larger than that of the p-side electrode 16 at the cleavage surfaces 13 and 14. Thus, the end portion electrode protection layer 18 joins directly to the insulating film 15 outside the p-side electrode 16. The length of the end portion electrode protection layer 18 in the waveguide length direction (the direction indicated by "D" in FIG. 15) is 50 μm both at the emission side and at the reflection side. Moreover, on the bottom surface of the n-type GaN substrate 11, there is provided an n-side electrode 17 that has, laid one after the other in the order named from the n-type GaN substrate 11 side, 500 Å thick Ti and 2 000 Å thick Al.

In the third embodiment, a pad electrode 19 is provided by laying, one after the other, 500 Å thick Pd and 6 000 Å thick Au from the cleavage surface 13 to the cleavage surface 14 so as to completely cover the p-side contact electrode 16 and the end portion electrode protection layer 18. The pad electrode 19 is for permitting, for example, a gold wire to be bonded thereto to electrically connect the nitride semiconductor laser element 10 to outside. By forming the pad electrode 19 thick enough to permit the gold wire to be bonded with sufficient bonding strength, it is possible to make the gold wire less likely to exfoliate, and thereby to enhance the reliability of the nitride semiconductor laser element 10. The end portion electrode protection layer 18 is formed before the n-type GaN substrate 11 having the pad electrode 19, the p-side contact electrode 16, the n-side electrode 17, the insulating film 15, and the nitride semiconductor layered portion 20 formed thereon—that is, the wafer (unillustrated)—is cleaved. When cleaving is performed, the end portion electrode protection layer 18 is, along with the n-type GaN substrate 11 etc., split into the shape shown in FIG. 15.

The pad electrode 19 may be formed with part of the insulating film 15 exposed as shown in FIG. 15, or may be formed over the entire top surface of the nitride semiconductor laser element 10. In a case where part of the insulating film 15 is left exposed, the pad electrode 19 can be easily formed, for example, by first covering the to-be-exposed part with a resist mask, then vapor-depositing the pad electrode 19, and then lifting it off, or by first vapor-depositing the pad electrode 19 all over, including in the to-be-exposed part, and then removing the pad electrode 19 only in the to-be-exposed part by wet etching.

In a case where, as in the third embodiment, a comparatively thick pad electrode 19 is arranged to reach the cleavage surfaces 13 and 14, when cleaving is performed, the pad electrode 19 may exfoliate from the end portion electrode protection layer 18 etc. near the cleavage surfaces 13 and 14. Even when the pad electrode 19 exfoliates, the p-side contact electrode 16 remains in close contact with the p-type GaN contact layer 27 even near the cleavage surfaces 13 and 14, and thus there is no risk of uneven current injection. There is, however, a risk of an exfoliated part of the pad electrode 19 sagging onto the cleavage surfaces 13 and 14 so as to make contact with the nitride semiconductor layered portion 20. This may cause short-circuiting, or may hamper the formation of protection coatings on the cleavage surfaces 13 and 14 after cleaving. This inconvenience can be overcome by not forming the pad electrode 19 near the cleavage surfaces 13 and 14. This will be described in connection with the fourth embodiment presented below.

Fourth Embodiment

Figure 16:
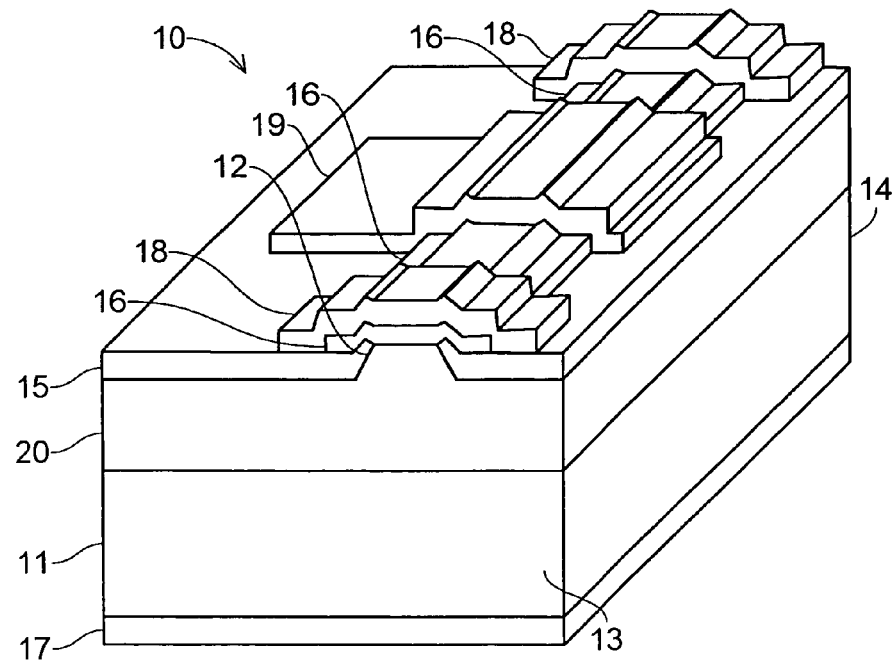
FIG. 16 is a perspective view of the nitride semiconductor laser element of a fourth embodiment of the present invention.

A fourth embodiment of the present invention will be described below with reference to FIG. 16. FIG. 16 is a perspective view of the nitride semiconductor laser element of the fourth embodiment. The fourth embodiment is the same as the third embodiment except that the pad electrode is formed only in a central part of the top surface of the nitride semiconductor laser element; therefore such parts as find their counterparts between these embodiments will be identified with common reference numerals. The fabrication method here also is largely the same as in the third embodiment.

As shown in FIG. 16, in the nitride semiconductor laser element 10 of the fourth embodiment, a nitride semiconductor layered portion 20 is formed on an n-type GaN substrate 11. The nitride semiconductor layered portion 20 is structured in the same manner as in the first embodiment, that is, as shown in FIG. 2. Moreover, a waveguide 12, an insulating film 15, an end portion electrode protection layer 18, a p-side contact electrode 16, and an n-side electrode 17 are provided as in the third embodiment.

In the fourth embodiment, a pad electrode 19 having 500 Å thick Pd and 6 000 Å thick Au laid one after the next is provided so as to cover a central part of the p-side contact electrode 16. Here, differently from in the third embodiment, the pad electrode 19 is not arranged above the end portion electrode protection layer 18 and near the cleavage surfaces 13 and 14. This pad electrode 19 can be easily patterned, for example, by a lift-off process as in the third embodiment.

With this structure, the pad electrode 19 is exempted from cleaving. Thus, there is no risk of the pad electrode 19 exfoliating at the time of cleaving to cause short circuiting or to hamper the formation of protection coatings on the cleavage surfaces 13 and 14 as in the third embodiment.

Moreover, in the fourth embodiment, in the pad electrode 19, a region for electrically connecting the nitride semiconductor laser element 10 to outside is provided outside the part of the pad electrode 19 located right above the ridge stripe shape of the waveguide 12. This region is so sized as to be somewhat larger than the diameter of the ball formed when a gold wire is bonded—specifically, it is sized, for example, 120 μm square—because boding can then be performed without problem. In this respect, in a case where the cavity length of the nitride semiconductor laser element 10, that is, the distance between the cleavage surfaces 13 and 14, is about 500 μm as it generally is, even when the region is formed only in a central part of the top surface of the nitride semiconductor laser element 10 so as not to reach the end portion electrode protection layer 18 as shown in FIG. 16, the region can be given a sufficient size.

This arrangement of the pad electrode 19, however, may require attention in respects other than bonding as described below. In a case where the thickness of the p-side contact electrode 16 is extremely small, for example 50 Å, the internal resistance of the p-side contact electrode 16 is too high to be ignored. In the fourth embodiment, between the end portion electrode protection layer 18 and the pad electrode 19, the p-side contact electrode 16 covering the waveguide 12 is exposed, and the part of the p-side contact electrode 16 that is not covered by the pad electrode 19 is large. Here, the current fed to the pad electrode 19 from outside the nitride semiconductor laser element 10 does not spread over the p-side contact electrode 16 because of the internal resistance thereof, and may be injected, only through a part thereof comparatively close to the pad electrode 19, toward the active layer 24. In this case, no current is injected in the region where the p-side contact electrode 16 is exposed, and thus no gain is obtained. This may cause an abnormality in the current-optical output characteristics. More specifically, in a case where the length of the part of the p-side contact electrode 16 that is not covered by the pad electrode 19 as measured in the waveguide length direction is 100 μm or more and the thickness of that part is 100 Å or less, the risk of the just described problem cannot be ignored.

Moreover, if the p-side contact electrode 16 covering the waveguide 12 is thin, a stress applied unintentionally from outside may damage the waveguide 12 and the nitride semiconductor layered portion 20, thereby degrading the reliability of the nitride semiconductor laser element 10.

These concerns can be cleared up by extending the pad electrode 19 closer to the cleavage surfaces 13 and 14 than in the fourth embodiment shown in FIG. 16 so that the end portion electrode protection layer 18 and the pad electrode 19 cover the entire top surface of the p-side contact electrode 16. This will be described in connection with the fifth embodiment presented below.

Fifth Embodiment

Figure 17:
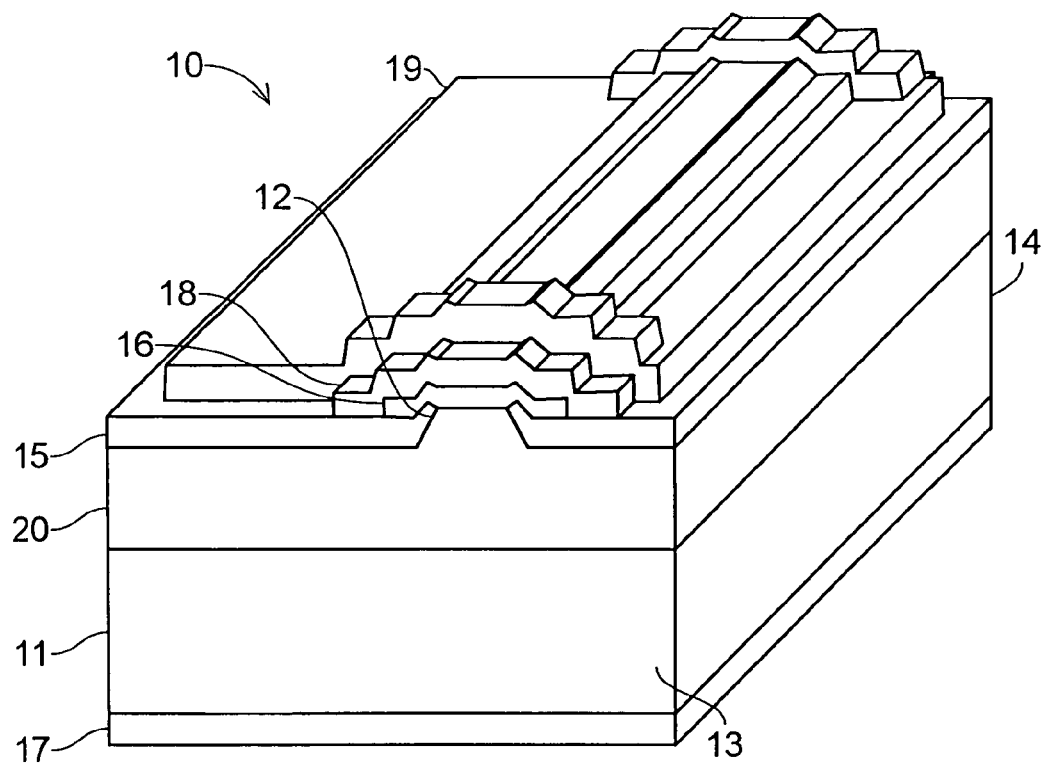
FIG. 17 is a perspective view of the nitride semiconductor laser element of a fifth embodiment of the present invention.

A fifth embodiment of the present invention will be described below with reference to FIG. 17. FIG. 17 is a perspective view of the nitride semiconductor laser element of the fifth embodiment. The fifth embodiment is the same as the fourth embodiment except that the pad electrode 19 is, along with the end portion electrode protection layer 18, so formed as to cover the entire top surface of the p-side contact electrode 16 and that the p-side contact electrode 16 is given a different thickness; therefore such parts as find their counterparts between these embodiments will be identified with common reference numerals. The fabrication method here also is largely the same as in the fourth embodiment.

As shown in FIG. 17, in the nitride semiconductor laser element 10 of the fifth embodiment, a nitride semiconductor layered portion 20 is formed on an n-type GaN substrate 11. The nitride semiconductor layered portion 20 is structured in the same manner as in the first embodiment, that is, as shown in FIG. 2. Moreover, a waveguide 12 and an insulating film 15 are formed as in the fourth embodiment, and a 100 Å thick p-side contact electrode 16 is provided in the same position and with the same shape as in the fourth embodiment. An n-side electrode 17 is also provided as in the fourth embodiment.

As shown in FIG. 17, in the fifth embodiment, a pad electrode 19 having 500 Å thick Pd and 6 000 Å thick Au laid one after the other is provided so as to cover the part of the p-side contact electrode 16 not covered by the end portion electrode protection layer 18 and part of the end portion electrode protection layer 18. Thus, no part of the top surface of the p-side contact electrode 16 is exposed. The length of the end portion electrode protection layer 18 in the waveguide length direction is 50 μm both at the emission side and at the reflection side. Moreover, as in the fourth embodiment, the pad electrode 19 is not arranged near the cleavage surfaces 13 and 14. This pad electrode 19 can be easily patterned, for example, by a lift-off process or a wet etching process as in the third embodiment.

With this structure, as in the fourth embodiment, it is possible to prevent the pad electrode 19 from exfoliating at the time of cleaving, and thereby to prevent it from causing short circuiting or hampering the formation of protection coatings on the cleavage surfaces 13 and 14 after cleaving. Moreover, of the part of the p-side contact electrode 16 covering the waveguide 12, emission-side and reflection-side portions each 50 μm long in the waveguide length direction are covered by the end portion electrode protection layer 18, and the rest is continuously covered by the pad electrode 19. Thus, even in a case where the thickness of the p-side contact electrode 16 is comparatively small, for example 100 Å, and thus the internal resistance thereof is high, the current fed to the pad electrode 19 from outside the nitride semiconductor laser element 10 can spread sufficiently over the waveguide 12 without problem via the following routes: in the part where the p-side contact electrode 16 is covered by the pad electrode 19, via the pad electrode 19 and the p-side contact electrode 16, which together have a sufficient thickness; and, even in the part where the p-side contact electrode 16 is covered by the end portion electrode protection layer 18, via the p-side contact electrode 16 itself, since it has a thickness of 50 μm at most in the waveguide length direction. Furthermore, needless to say, even if a stress is applied unintentionally from outside, it is less likely to damage the waveguide 12 and the nitride semiconductor layered portion 20 than in a case where the p-side contact electrode 16 is exposed. Thus, it is possible to make the nitride semiconductor laser element 10 less prone to an abnormality in the current-optical output characteristic resulting from uneven current injection and less prone to degraded reliability on application of a stress from outside.

In all the nitride semiconductor laser elements of the third to fifth embodiments of the present invention thus far described, the end portion electrode protection layer 18 is formed only near the emission-side and reflection-side cleavage surfaces 13 and 14, and, for example, a gold wire is bonded to the pad electrode 19 for electrical connection to outside. Alternatively, at the same time that the end portion electrode protection layer 18 is formed, a film having the same structure may be formed right below the part where the gold wire is bonded. This helps alleviate the damage that the nitride semiconductor layered portion 20 receives at the time of bonding without adding an extra step in the fabrication procedure of the nitride semiconductor laser element. This will be described in connection with the sixth embodiment presented below.

Sixth Embodiment

Figure 18:
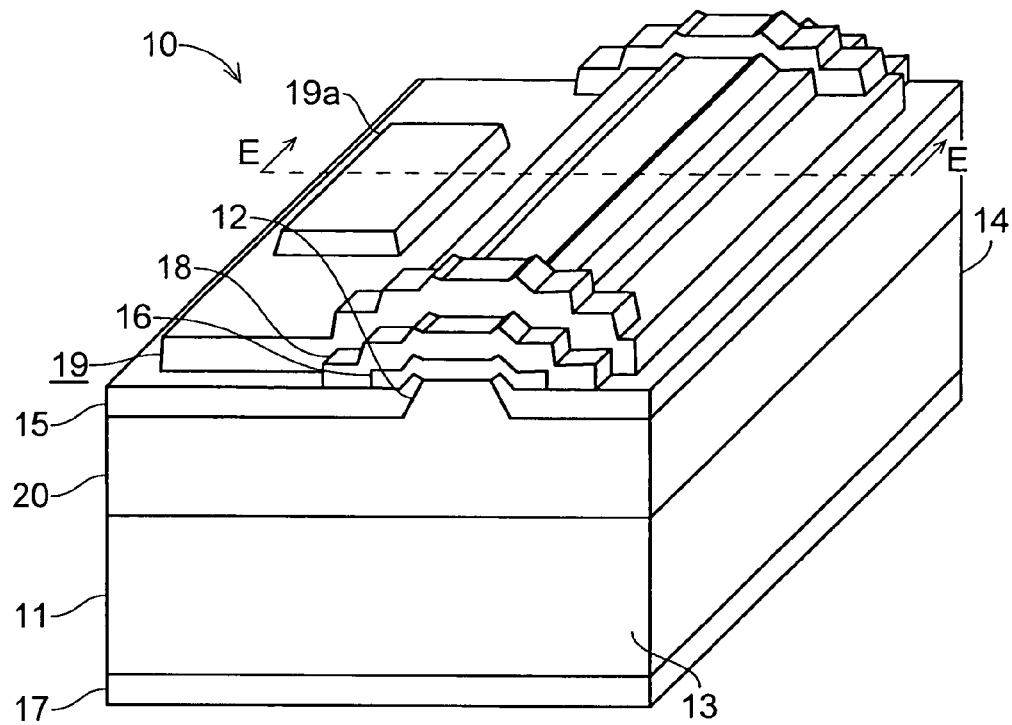
FIG. 18 is a perspective view of the nitride semiconductor laser element of a sixth embodiment of the present invention.
Figure 19:
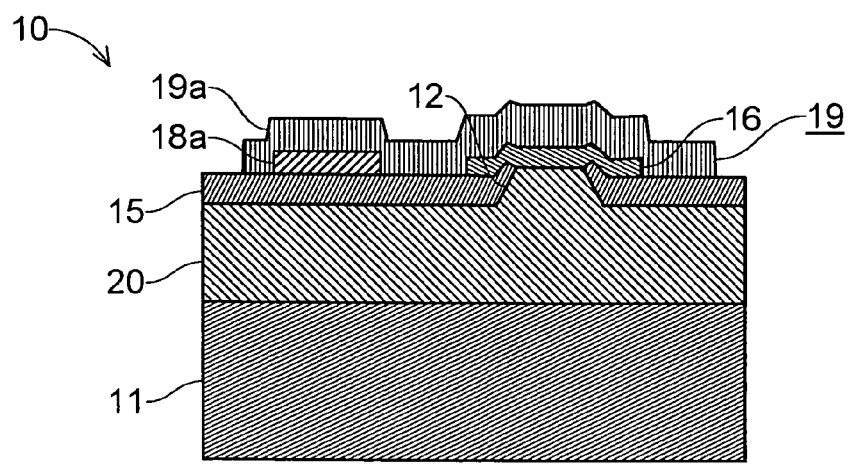
FIG. 19 is a cross-sectional view of FIG. 18 along line E-E.
Figure 20:
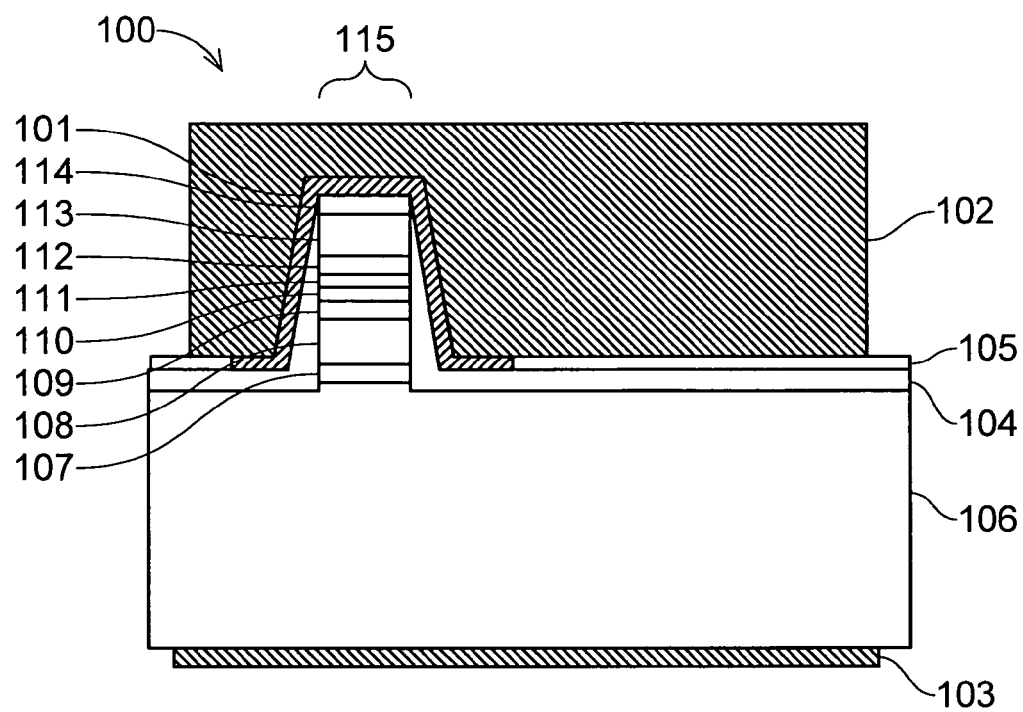
FIG. 20 is a schematic cross-sectional view of a conventional nitride semiconductor laser element.

A sixth embodiment of the present invention will be described below with reference to FIGS. 18 and 19. FIG. 18 is a perspective view of the nitride semiconductor laser element of the sixth embodiment, and FIG. 19 is a cross-sectional view of FIG. 18 along line E-E. The sixth embodiment is the same as the fifth embodiment except that a film having the same structure as the end portion electrode protection layer 18 is provided right below the part of the pad electrode 19 where a gold wire is bonded; therefore such parts as find their counterparts between these embodiments will be identified with common reference numerals. The fabrication method here also is largely the same as in the fifth embodiment.

As shown in FIGS. 18 and 19, in the nitride semiconductor laser element 10 of the sixth embodiment, a nitride semiconductor layered portion 20 is formed on an n-type GaN substrate 11. The nitride semiconductor layered portion 20 is structured in the same manner as in the first embodiment, that is, as shown in FIG. 2. Moreover, a waveguide 12, an insulating film 15, and a pad electrode 19 are formed as in the fifth embodiment, and a 100 Å thick p-side contact electrode 16 is provided in the same position and with the same shape as in the fifth embodiment. An n-side electrode 17 is also provided as in the fifth embodiment.

As shown in FIG. 18, in the sixth embodiment, a wire bonding portion 19a to which to bond a gold wire is provided by elevating part of the pad electrode 19. As shown in FIG. 19, in the wire bonding portion 19a, right below the pad electrode 19, a reinforcing layer 18a is provided that has the same structure as the end portion electrode protection layer 18.

With this structure, even in a case where a gold wire or the like is bonded to the wire bonding portion 19a of the pad electrode 19 with an increased ultrasonic output or with an increased load with a view to increasing the bonding strength of the gold wire or the like and thereby increasing the reliability of the nitride semiconductor laser element 10, it is possible to greatly alleviate the damage to the nitride semiconductor layered portion 20 and the resulting degradation of the reliability of the nitride semiconductor laser element 10.

The reinforcing layer 18a can be easily formed by a lift-off process, for example, simply by modifying the second resist mask 42 used to form the end portion electrode protection layer 18 shown in FIG. 9 in such a way that it also has an opening where the reinforcing layer 18a is formed. Thus, the reinforcing layer 18a can be formed without adding an extra step or increasing the process time.

In the sixth embodiment, the two parts of the end portion electrode protection layer 18 and the reinforcing layer 18a are formed separately. It is, however, also possible to integrally form two or more of these without any problem.

The sixth embodiment has been described as a modified version of the nitride semiconductor laser element 10 of the fifth embodiment shown in FIG. 17. It is, however, also possible to implement the sixth embodiment as a modified version of the nitride semiconductor laser element 10 of the third embodiment shown in FIG. 15 or the fourth embodiment shown in FIG. 16.

It should be understood that how the present invention is practiced is not limited to what has been described specifically above as the first to sixth embodiments thereof.

Next, modified examples of the present invention will be described. In the present specification, "nitride semiconductors" include semiconductors in which part of the Ga contained in gallium nitride (GaN) has been replaced with another group III element, for example $Ga_sAl_tIn_{1-s-t}N$ (where $0 < s \leq 1$, $0 \leq t < 1$, and $0 < s+t \leq 1$), and include semiconductors in which part of an element contained therein is replaced with an impurity or to which another impurity is added.

The p-side electrode 16 in the first and second embodiments and the p-side contact electrode 16 in the third to sixth embodiments are formed of 100 Å thick or 500 Å thick Pd. Here, Pd may be replaced with Ni, Ti, or the like, and another metal such as Au or Mo may further be laid thereon; the thickness may also be other than specifically mentioned in the embodiments.

In the third to sixth embodiments, the pad electrode 19 has a two-layer structure having 500 Å thick Pd and 6 000 Å thick Au laid one after the other in this order. Here, Au and Pd may each be replaced with Ni, Ti, Rh, Mo, or the like, or a plurality of metals may be laid one after another; the thickness may also be other than specifically mentioned in those embodiments. In the first to sixth embodiments, the n-side electrode 17 has a two-layer structure having 500 Å thick Ti and 2 000 Å thick Al laid one after the other in this order. Here, Ti may be replaced with Hf or V, and Al may be replaced with Au; the thickness may be other than specifically mentioned in those embodiments; another metal layer may further be laid on those metals to form a structure composed of three or more layers.

In the first to sixth embodiments, the insulating film 15 and the end portion electrode protection layer 18 are each formed of $SiO_2$, or each have a two-layer structure of $SiO_2$ and $TiO_2$. Here, it is possible to use instead a single layer of $SiO_2$, or another inorganic dielectric material such as SiO, $Ta_2O_5$, or SiN, or a gallium nitride-based compound semiconductor such as AlGaN, or a layered structure obtained by combining two or more of these together; the thickness may also be other than specifically mentioned in the embodiments. The process used may also be other than an electron beam vapor-deposition process as specifically mentioned in the description of the embodiments; for example, a sputtering process, a plasma CVD process, or the like may instead be used.

In the first to sixth embodiments of the present invention, a reactive ion etching process is used as a dry etching process. Instead, it is also possible to use a reactive ion beam etching process, an inductively coupled plasma etching process, an ECR (electron cyclotron resonance) plasma etching process, or the like to perform the desired etching, so long as a similar process gas is used.

In the first to sixth embodiments of the present invention, resist masks are used as the first mask layer for forming a ridge stripe-shaped waveguide and as the second mask layer for forming an end portion electrode protection layer. Instead, it is possible to use an inorganic dielectric material such as AlN, a metal such as Ti, or a layered structure obtained by combining them together.

What is claimed is:

1. A nitride semiconductor laser element comprising:
   a substrate;
   a nitride semiconductor layered portion having a plurality of nitride semiconductor layers laid one after another on the substrate, and having a ridge stripe-shaped waveguide provided therein;
   an insulating layer formed on the nitride semiconductor layered portion and having an opening above the waveguide;
   a first electrode provided above the waveguide and the insulating layer; and
   a cavity end face perpendicular to a length direction of the waveguide, wherein,
   above the first electrode, an end portion electrode protection layer is provided of which an end face is flush with the end face of the cavity, and
   part of the end portion electrode protection layer is located directly above a central longitudinal axis of the waveguide,
   wherein the end portion electrode protection layer is contiguous with the first electrode, and is contiguous with the insulating layer on at least one side of the first electrode with respect to a direction perpendicular to the length direction of the waveguide.

2. The nitride semiconductor laser element according to claim 1,
   wherein the end portion electrode protection layer and the insulating layer are each composed of one or more layers, and a layer of the end portion electrode protection layer contiguous with the first electrode and a layer of the insulating layer contiguous with the first electrode are formed of a same material.

3. The nitride semiconductor laser element according to claim 1,
wherein the end portion electrode protection layer and the insulating layer are each composed of two or more layers, and have symmetric layer structures with respect to the first electrode.

4. The nitride semiconductor laser element according to claim 1,
wherein the first electrode has a thickness of 30 Å or more but 1 000 Å or less.

5. The nitride semiconductor laser element according to claim 1,
wherein a second electrode is provided above the first electrode and the insulating layer.

6. The nitride semiconductor laser element according to claim 5,
wherein the second electrode has a wire bonding portion to which a wire is bonded to electrically connect the nitride semiconductor laser element to outside, and the second electrode has, in the wire bonding portion, a reinforcement layer below the second electrode, the reinforcement layer having a same layer structure as the end portion electrode protection layer.

7. The nitride semiconductor laser element according to claim 1,
wherein a second electrode is provided above the end portion electrode protection layer, the first electrode, and the insulating layer.

8. The nitride semiconductor laser element according to claim 7,
wherein the second electrode has an end face thereof located inward of the end face of the cavity.

9. The nitride semiconductor laser element according to claim 7,
wherein the second electrode has a wire bonding portion to which a wire is bonded to electrically connect the nitride semiconductor laser element to outside, and the second electrode has, in the wire bonding portion, a reinforcement layer below the second electrode, the reinforcement layer having a same layer structure as the end portion electrode protection layer.

10. The nitride semiconductor laser element according to claim 1, wherein, above the waveguide, elsewhere than near the end face of the cavity, there is a region where the end portion electrode protection layer is not provided.

11. The nitride semiconductor laser element according to claim 1, wherein the end portion electrode protection layer is contiguous with the insulating layer on at least one side of the end portion electrode protection layer with respect to a direction perpendicular to the length direction of the waveguide, and the end portion electrode protection layer contains at least a dielectric material or a compound semiconductor comprising AlGaN.

12. The nitride semiconductor laser element according to claim 1, wherein the end portion electrode protection layer extends along the cavity end face as a continuous structure.

13. The nitride semiconductor laser element according to claim 1, wherein an end part of the end portion electrode protection layer does not terminate over the waveguide.

14. A nitride semiconductor laser element comprising:
a substrate;
a nitride semiconductor layered portion having a plurality of nitride semiconductor layers laid one after another on the substrate, and having a ridge stripe-shaped waveguide provided therein;
an insulating layer formed on the nitride semiconductor layered portion and having an opening above the waveguide;
a first electrode provided above the waveguide and the insulating layer; and
a cavity end face perpendicular to a length direction of the waveguide, wherein,
above the first electrode, an end portion electrode protection layer is provided of which an end face is flush with the end face of the cavity, the end portion electrode protection layer extending along the cavity end face so as to cross over the ridge stripe-shaped waveguide,
wherein the end portion electrode protection layer is contiguous with the first electrode, and is contiguous with the insulating layer on at least one side of the first electrode with respect to a direction perpendicular to the length direction of the waveguide.

* * * * *